(12) United States Patent
Nicholls

(10) Patent No.: US 7,764,133 B1
(45) Date of Patent: Jul. 27, 2010

(54) TIME BASED PREDICTIVE ALGORITHM SYSTEM FOR A CRYSTAL OSCILLATOR

(75) Inventor: Charles Nicholls, Nepean (CA)

(73) Assignee: Nortel Networks Limited, St. Laurent, Quebec (CA)

(*) Notice: Subject to any disclaimer, the term of this patent is extended or adjusted under 35 U.S.C. 154(b) by 193 days.

(21) Appl. No.: 12/172,227

(22) Filed: Jul. 12, 2008

Related U.S. Application Data

(60) Provisional application No. 60/949,276, filed on Jul. 12, 2007.

(51) Int. Cl.
*G01R 23/02* (2006.01)

(52) U.S. Cl. .................... 331/69; 331/44; 331/176

(58) Field of Classification Search ............ 331/44, 331/66, 69, 175, 176

See application file for complete search history.

(56) References Cited

U.S. PATENT DOCUMENTS 7,466,209 B2 * 12/2008 Babitch .................. 331/66

* cited by examiner

*Primary Examiner*—Robert Pascal
*Assistant Examiner*—James E Goodley
(74) *Attorney, Agent, or Firm*—Garlick Harrison & Markison; James A. Harrison

(57) ABSTRACT

A system and method include receiving an external reference signal and generating first temperature control commands to maintain a constant ambient temperature for a crystal oscillator using a first temperature control system. The method further includes generating second temperature control commands for a second temperature control system to establish a desired ambient temperature for the crystal oscillator according to a temperature training profile. While at least one of the first and second temperature control systems operates to change an ambient temperature, the method includes extracting a clock from the external reference signal, generating a correction signal to further generate a corrected oscillation based on a difference between the extracted clock and the crystal oscillator and training an adaptive control algorithm based on the correction signal in relation to a determined crystal oscillator response to temperature variations caused by the second temperature control system.

21 Claims, 7 Drawing Sheets communication system 100 base station 150 clock system 200 heater system 300 correction signal versus voltage curve 350

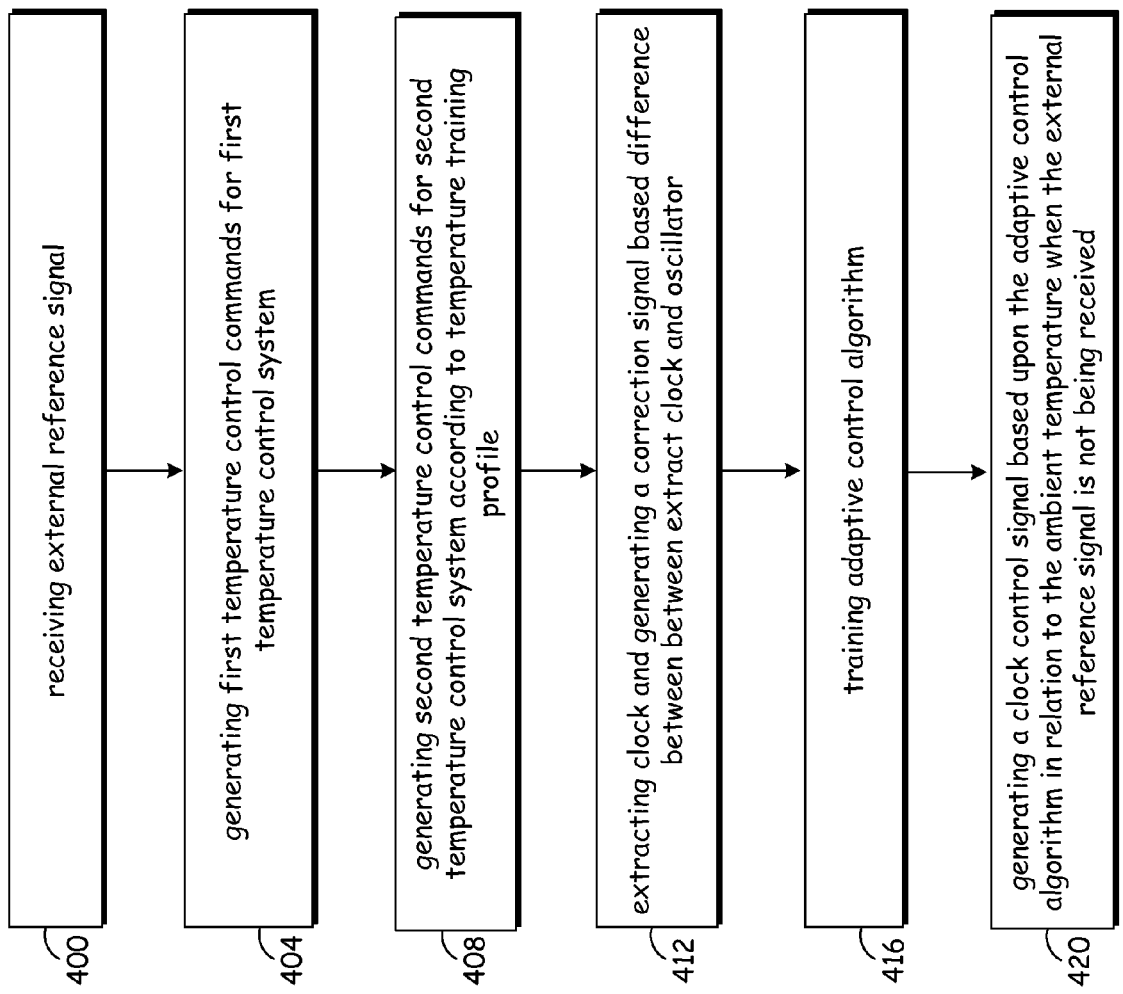

TIME BASED PREDICTIVE ALGORITHM SYSTEM FOR A CRYSTAL OSCILLATOR

CROSS REFERENCE TO RELATED APPLICATIONS

The present U.S. Utility Patent Application claims priority pursuant to 35 U.S.C. §119(e) to the following U.S. Provisional Patent Application titled as TIME BASE PREDICTIVE ALGORITHM AND ITS APPLICATION ASSOCIATED WITH AN OVEN CONTROLLED OSCILLATOR and having Ser. No. 60/949,276, and a filing date of Jul. 12, 2007.

TECHNICAL FIELD OF THE INVENTION

This invention relates generally to wireless communication systems and, more particularly, to timing and clock synchronization/syntonization for communication systems.

DESCRIPTION OF RELATED ART

Providing seamless end-to-end call connectivity across the various platforms to support voice and data calls is a challenge that has been pursued and for which many partial solutions have been developed. There is a need, however, to find more efficient and less expensive solutions. As such, small and large, as well as private and public, wireless data networks are being created to seamlessly interact with large wire line networks to enable users to establish point-to-point connections independent of terminal type and location while meeting increasingly competitive cost pressures.

Initial wireless voice networks, including AMPS, Time Division Multiple Access (TDMA) including North American TDMA and Global System for Mobile Communications (GSM), were used to conduct data in a limited capacity. These networks are being replaced, however, by newer wireless data-only networks, as well as data and voice networks.

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of co-channel and adjacent channel interference that may be caused by transmissions on a particular channel.

In cellular systems, a plurality of base stations is distributed across the service area. Each base station services wireless communications within a respective cell. Each cell may be further subdivided into a plurality of sectors. In many cellular systems, e.g., GSM cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Traditional wireless mobile networks include Mobile Station Controllers (MSCs), Base Station Controllers (BSCs) and Base Transceiver Station (BTS) systems that jointly operate to communicate with mobile stations over a wireless communication link. Examples of common networks include the GSM networks, North American TDMA networks and Code Division Multiple Access (CDMA) networks. Extensive infrastructures (e.g., ANSI-41 or MAP-based networks) exist in the cellular wireless networks for tracking mobility, distributing subscriber profiles, and authenticating physical devices. Each of these communications, however, must be timed appropriately to avoid unnecessary interference with other communications.

To establish a wireless communication link in traditional wireless voice networks, an MSC communicates with a BSC to prompt the BTS (collectively "Base Station" or "BS") to generate paging signals to a specified mobile station within a defined service area typically known as a cell or sector (a cell portion). The mobile station, upon receiving the page request, responds to indicate that it is present and available to accept an incoming call. Thereafter, the BS, upon receiving a page response from the mobile station, communicates with the MSC to advise it of the same. The call is then routed through the BS to the mobile station as the call setup is completed and the communication link is created. Alternatively, to establish a call, a mobile station generates call setup signals that are processed by various network elements in a synchronized manner to authenticate the user as a part of placing the call. The authentication process includes, for example, communicating with a Home Location Register (HLR) to obtain user and terminal profile information.

Wireless communication systems, including existing base stations for all type of communication networks, typically require either time synchronization as is required in code division multiple access (CDMA) systems or frequency syntonization as is required in global system for mobile communications (GSM) and universal mobile telecommunication systems (UMTS). Similarly, wired and optical networks also often have requirements for time synchronization or frequency syntonization of signals. Generally, a frequency syntonization implies the process of setting one frequency equal to that of another. For example, a process of setting one oscillator frequency equal to that of another is a process of frequency syntonization.

Generally, internal clocks are used to define the timing for transmitting and receiving communication signals as well as the characteristics of the signal. For example, a pulse that is required to start at time t0 may be required to have a specified pulse length. If the pulse starts early, for example, the pulse length may appear shorter than required and the communication may fail or be misinterpreted. By assuming that certain devices have synchronized clocks, however, designers are able to improve network capabilities and efficiencies. This assumption, however, must be realized. Many different synchronization and syntonization systems are known. In general, however, the different synchronization and syntonization systems are characterized by their cost and their effectiveness. Any system that reduces cost or improves effectiveness for time synchronization or frequency syntonization is desirable.

BRIEF SUMMARY OF THE INVENTION

A system and method provided for time synchronization and/or frequency syntonization includes a dual temperature control system to support periodic training of an adaptive algorithm that compensates for frequency changes of an oscillator crystal due to temperature and other performance degradations. Generally, transceiver circuitry for transmitting and receiving communication signals within a network includes a clock system within a communication device that is operable to train for temperature based frequency drift and to generate clock signals that are compensated for temperature based frequency drift when a reference clock is not being received. The clock system further includes a crystal oscillator that generates a reference clock, a first temperature control system that further includes a first temperature controller that adjusts temperature settings to maintain a first specified ambient temperature for the crystal oscillator, a second temperature controller, and a temperature control logic that generates temperature control commands to the second temperature controller to establish a second specified ambient temperature for the crystal oscillator. The temperature based frequency drift compensation thus compensates for a frequency drift of the reference clock produced by the crystal oscillator.

The clock system extracts a clock from a received reference signal and generates a correction signal to further generate a corrected oscillation based on a difference between the extracted clock received from the reference signal and the reference clock produced by the crystal oscillator. The clock system also generates the temperature control commands for the second temperature control system according to a temperature training profile and trains an adaptive control algorithm based on the correction signal in relation to a determined crystal oscillator response to temperature variations.

The clock system receives a reference signal in a communication from an external device or system. The clock system also extracts a clock from the external reference signal and generates a correction signal to further generate a corrected oscillation based on a difference between the extracted clock and the crystal oscillator. The clock system generates first temperature control commands to maintain a constant ambient temperature for a crystal oscillator using a first temperature control system to reduce temperature based frequency drift. The clock system also trains an adaptive control algorithm by generating second temperature control commands for a second temperature control system to establish a desired ambient temperature for the crystal oscillator. The adaptive control algorithm then determines a crystal oscillator response based on ambient temperature changes and based on the correction signal in relation to the ambient temperature changes. In one embodiment, the temperature control commands are generated according to a temperature training profile. The temperature changes are monitored in terms voltage magnitudes of a correction signal for the first temperature control system in one embodiment though actual temperature readings may be used as well.

BRIEF DESCRIPTION OF THE SEVERAL VIEWS OF THE DRAWINGS

FIG. 7 is a flow chart that illustrates a method according to one embodiment of the invention.

DETAILED DESCRIPTION OF THE INVENTION

Figure 1:
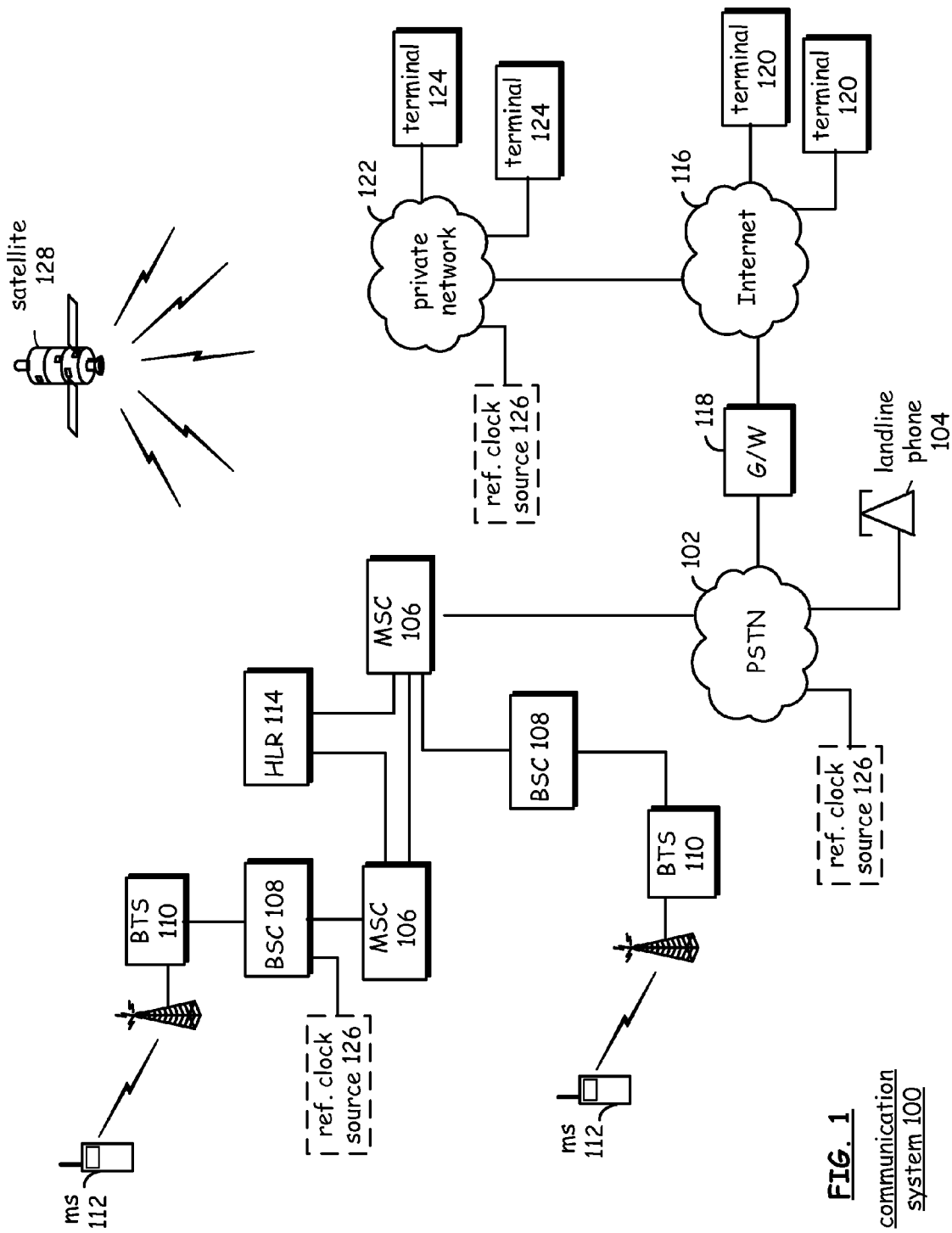
FIG. 1 is a communication system that includes a plurality of networks and network devices that create communication paths between various user terminals and other endpoint devices whose communications rely on clock/timing synchronization according to one embodiment of the invention.

FIG. 1 is a communication system that includes a plurality of networks and network devices that create communication paths between various user terminals and other endpoint devices whose communications rely on clock/timing synchronization according to one embodiment of the invention. The communication system 100 includes networks of different types that cooperate to establish communications from endpoints in different networks. For example, a public switched telephone network (PSTN) 102 provides infrastructure to support communications to and from landline phone 104. At least one cellular network includes one or more mobile switching centers (MSCs) 106 to support call routing, base station controllers (BSCs) 108, base transceiver stations (BTSs) 110 wherein the BSCs 108 and BTSs 110 work collectively to connect calls to mobile stations (MSs) 112. Additionally, a home location register (HLR) 114 is operable to track a list of MS 112 that are assigned to its service area as well as any visiting MSs 112 that have been identified as being with the HLR 114 service area. Descriptions of the operation of these cellular elements are abbreviated because they are well known in the art.

System 100 further includes a data packet network 116 (shown as "Internet") that is operably coupled to PSTN 102 through a gateway 116, a plurality of user terminals 120, and a private network 122. Private network 122 is further coupled to a plurality of user terminals 124. Both networks 116 and 122 represent one or more networks that operate to transport data using one or more communications protocols and infrastructures. For example, networks 116 and 122 may comprise a large plurality of nodes or network access points for one or more different network infrastructures including wire line and fiber optic network cabling and associated components. Finally, as may be seen, system 100 includes one or more remote reference clock sources 126 that provide communication signals from which a reference clock may be received or extracted. All references herein to received, determining, identifying or extracting a clock generally refer to a common step of receiving a signal from which a clock may be determined or extracted. Every known form for such processing may readily be substituted for one that is stated or claimed. One particular reference signal that is of interest is a satellite based communication signal from a satellite 128 from which a clock signal may be received and extracted or determined. In one embodiment, satellite 128 is a global positioning satellite (GPS) that provides reliable communication signals from which a clock may be extracted.

In general, a plurality of the devices or elements of system 100 rely on a common clock to coordinate communications. Thus, as may be seen, these devices or elements synchronize their internal clocks and adjust their oscillator outputs to create correction signals that are based upon a reference clock that is extracted or received from reference clock sources 126 or satellite 128. Without synchronizing clocks, some of the communications of network 100 may conflict.

Figure 2:
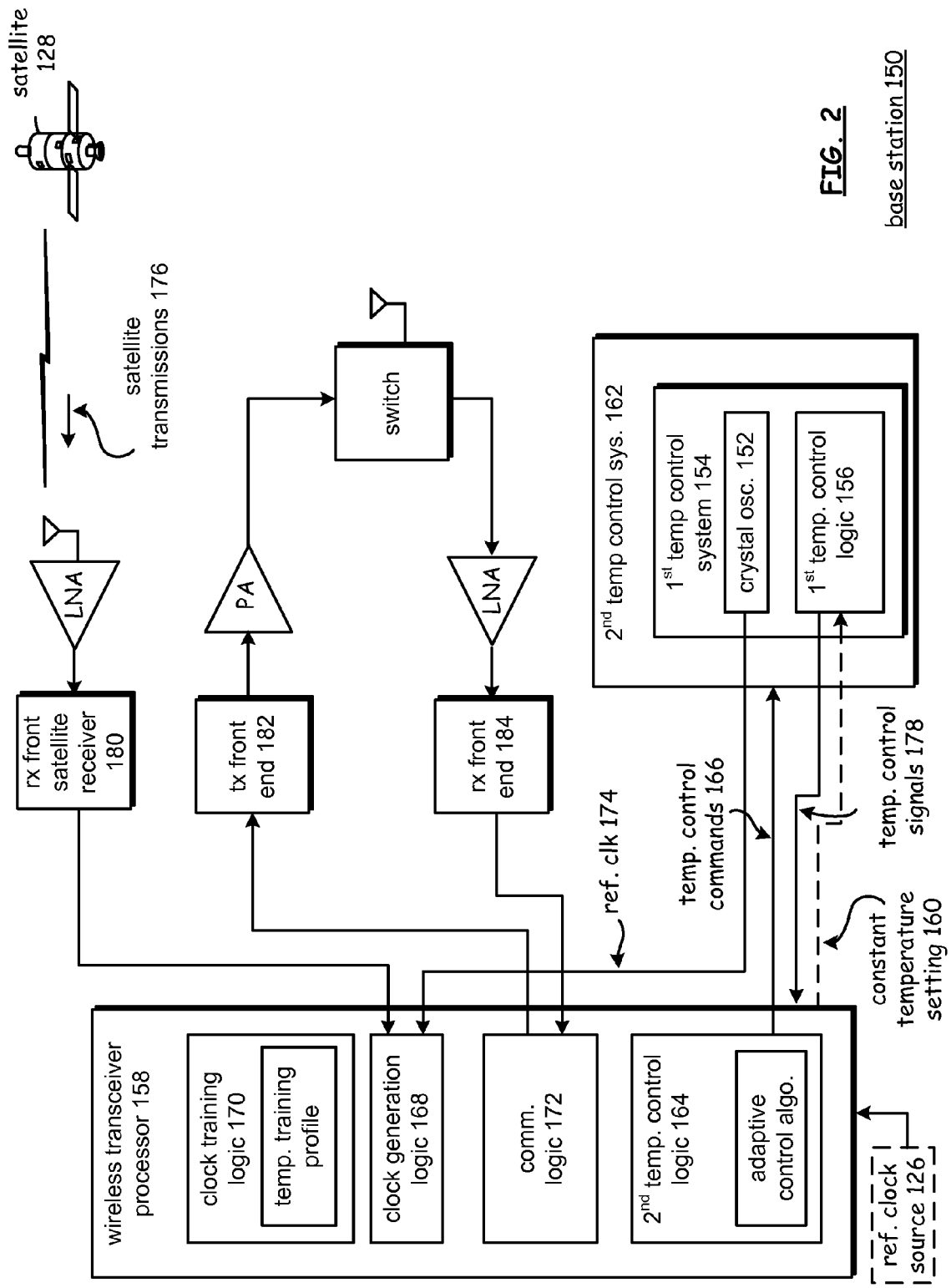
FIG. 2 is a functional block diagram of a base station in communication with one of a satellite or a reference clock source to receive a reference clock according to one embodiment of the invention.

FIG. 2 is a functional block diagram of a base station in communication with one of a satellite or a reference clock source to receive a reference clock according to one embodiment of the invention. Present base station architectures require the base stations to be time synchronized relative to each other and/or with other network elements such as, for example, the mobile stations. In some applications, a lack of synchronization and/or syntonization can cause signal collisions and/or conflicts. In order to achieve synchronization and/or syntonization, the base stations include a stable local oscillator which is phase locked to a reference such as satellite based reference. The base station of the present embodiment includes logic for generating an accurate temperature based clock in the event that the reference signal is interrupted. The logic specifically includes an adaptive training algorithm that is operable to determine and correct crystal oscillator drift due to ambient temperature variations.

The effectiveness of the adaptive training algorithm is dependent on there being a measurable temperature variation during a locked mode of operation in which a reference signal is being received and a clock is being extracted. Such a temperature variation can presently only be guaranteed, however, if there is a factory holdover test period in which the temperature is artificially ramped over an adequate time frame to ensure convergence of the training algorithm especially when the base station is deployed in a constant ambient temperature environment. In a production environment minimization of test time is critical. Accordingly, the base station of the present embodiment includes a clock system that is operable to change ambient temperature conditions for a crystal oscillator to train the adaptive training algorithm while performing routine base station operations.

A base station (BS) 150 includes a clock system which is operable to receive or extract a reference clock from a received communication signal transmitted by a remote device. Here, the remote device is satellite 128. Optionally, a reference clock source 126 may be used in place of satellite 128. BS 150 includes transceiver circuitry for transmitting and receiving wireless communication signals within a cellular or a wireless data network. The clock system of BS 150 includes a crystal oscillator 152 that generates a reference oscillation used, in part, to generate an oscillation that is used in a phase-locked loop to generate a signal having a desired center frequency by down-converting an ingoing communication signal or by up-converting an outgoing communication signal.

In the described embodiment, crystal oscillator 152 is disposed within or proximate to a first temperature control system 154. In one embodiment, first temperature control system 154 is a temperature chamber that includes first temperature control logic 156 that operates to maintain a constant ambient temperature for crystal oscillator 152. First temperature control system 154 includes a temperature gauge (not shown) that is disposed proximate to a crystal oscillator and generates internal control commands to maintain the constant ambient temperature. In one embodiment, the constant ambient temperature is a programmable temperature and may be received from one of a plurality of sources including a system processor. In the embodiment of FIG. 2, wireless transceiver processor 158 generates and produces constant temperature setting 160 to first temperature control logic 156.

Base station 150 further includes a second temperature control system 162 that establishes an ambient temperature about first temperature control system 154 and crystal oscillator 152. Accordingly, as second temperature control system 162 establishes an ambient temperature, first temperature control logic 156 generates internal control signals (not shown) to maintain the constant ambient temperature as specified by constant temperature setting 160. Wireless transceiver processor 158 includes second temperature control logic 164 that generates temperature control commands 166 that are produced to second temperature control system 162 to establish a specified ambient temperature. Thus, while first temperature control logic 156 operates to maintain a constant temperature as a first ambient temperature about crystal oscillator 152, second temperature control logic 164 generates temperature control commands 166 to establish a second ambient temperature. In one embodiment, second temperature control logic 164 generates temperature control commands 166 according to a specified temperature training algorithm defined within second temperature control logic 164.

A clock system of base station 150 includes each of elements 152-156 and 162-164 as well as clock generation logic 168 and clock training logic 170. In the described embodiment, logic 168 and 170 are formed within wireless transceiver processor 158. Wireless transceiver processor 158 also includes communication logic 172. Each of these logics 168-172 as well as logic 164 may be formed in hardware logic, in software (computer instructions stored in memory and executed by processor 158), or in a field programmable gate array (FPGA).

The clock system extracts a clock from satellite based transmissions 176 that are received through communication logic 172 and generates a correction signal to further generate a corrected oscillation based on a difference between the extracted clock and a reference clock 174 produced by crystal oscillator 152. The clock system further generates the temperature control commands for the second temperature control system according to a temperature training profile to train an adaptive control algorithm within logic 164. In one embodiment, the adaptive control algorithm maps frequency correction signals in relation to the ambient temperature about the crystal oscillator 152. In the described embodiment, the adaptive control algorithm maps frequency correction signals (to produce a desired frequency oscillation) in relation to a magnitude of the temperature control signals 178 generated by first temperature control logic 156 to maintain the constant ambient temperature.

Accordingly, as a crystal oscillator reference signal frequency drifts due to temperature variations of the ambient temperature, a frequency correction signal is mapped to the ambient temperature or to the signal magnitude of the temperature control signals 178 of the first temperature control system 154. Thus, a determined crystal oscillator response to temperature variations is stored and used to subsequently generate an accurate oscillation frequency that compensates for temperature effects on the crystal oscillator when a reference clock is not being received. References herein to training the adaptive control algorithm include, generally, a method for changing the ambient temperature about the crystal in a field deployed unit to facilitate developing a mapped relationship for a range of temperatures to facilitate the clock system having a plurality of temperature to correction signal values.

The clock system of base station 150 operates in a locked mode when the clock is being extracted from the received satellite based transmissions which are received through satellite receiver circuitry 180. In this locked mode, the clock system generates the temperature control commands 166 and trains the adaptive control algorithm while transmitting and receiving wireless communication signals within the cellular or wireless data networks through transmit and receive front ends 182 and 184, respectively, of BS 150. This training is continuous in one embodiment of the invention while a reference signal or clock is being received and extracted and is periodic in another mode of the invention. The temperature control commands 166 are defined within a temperature training profile in one embodiment of the invention.

The temperature training profile includes, in the described embodiment, temperature swings within a limited range to reflect naturally occurring temperature swings and/or to stay within acceptable tolerances of the circuitry to not introduce error into the training of the adaptive control algorithm. In an embodiment in which the training is periodic, a frequency of the training is one that satisfactorily compensates for performance degradation of components within the clock system. Such periodic frequency can be determined by one of average skill in the art according to specified system usage and reliability requirements.

The locked mode, as described above, is one in which a reference clock is being received and extracted. When the clock system is not in a locked mode, however, the clock system is in a holdover mode. In the holdover mode, the clock system generates a correction signal for the crystal oscillation to correspond with a correction signal that is generated based on ambient temperature as previously determined in training. This ambient temperature may be specifically determined through a temperature sensor reading or, as described before, on a temperature control signal magnitude. Thus, in one embodiment, the clock system evaluates the magnitude of temperature control signals generated by the first temperature control logic 156 to determine or identify a corresponding correction signal that should be generated to adjust the crystal oscillator reference clock 152. In the described embodiment, the clock system generates a correction signal through digital processing by a processor though it should be understood that portions of the described processing may readily be implemented in hardware. Further, while in the holdover mode, the clock system does not perform training of the adaptive control algorithm and therefore generates the temperature control commands 166 for the second temperature control system having a constant value. Thus, training occurs only in the locked mode. The correction signal magnitude may be a current magnitude or a voltage magnitude which is used to bias a transistor which controls current flow through a heating element (e.g., a heater or an "oven"). The references herein this specification to the "clock system" more generally refer to operation or structure of a communication device which, in FIG. 2, is exemplified by a base station.

Figure 3:
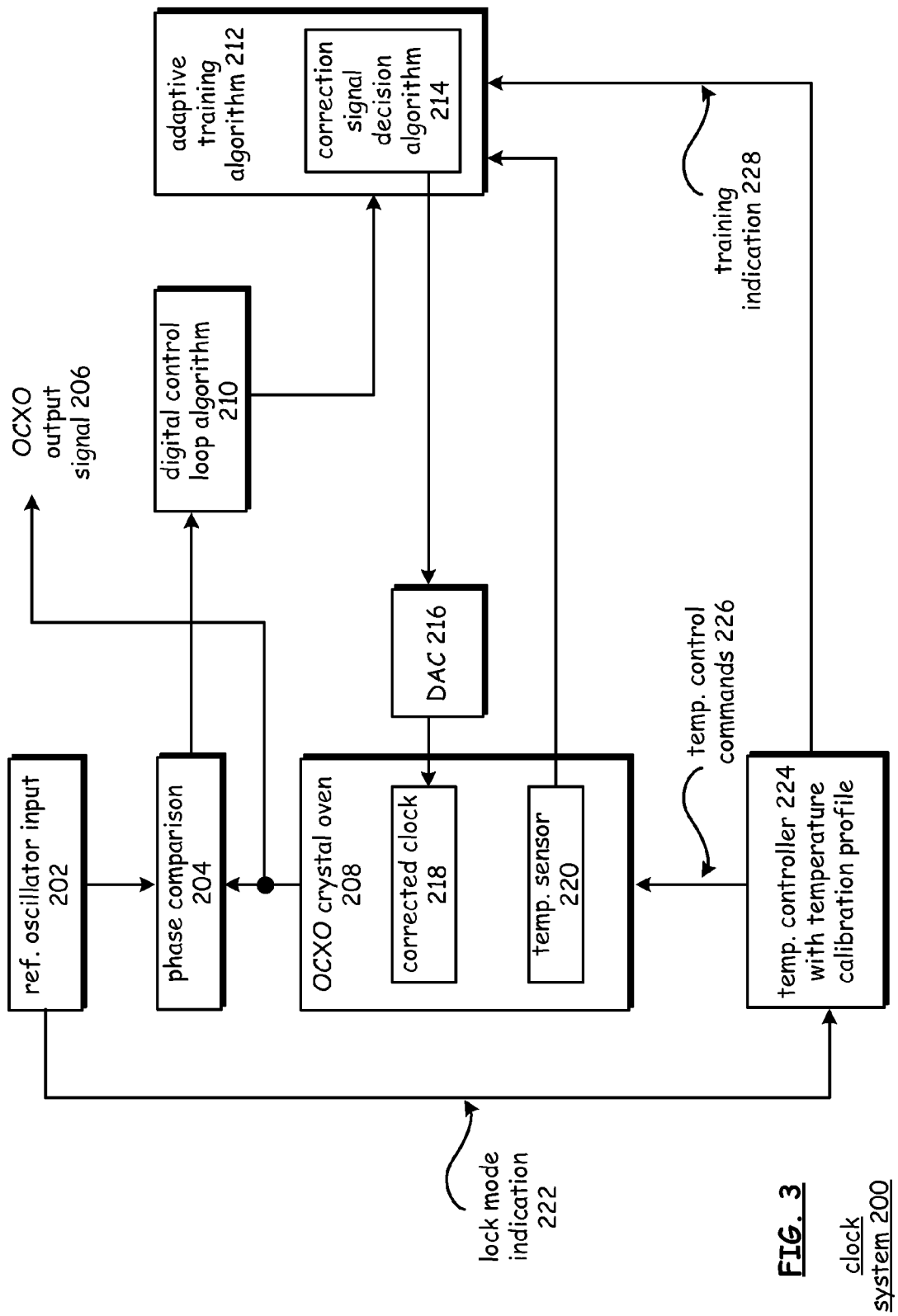
FIG. 3 is a functional block diagram that illustrates various aspects of a clock system according to one embodiment of the invention.

FIG. 3 is a functional block diagram that illustrates various aspects of a clock system according to one embodiment of the invention. As may be seen, a reference oscillator input 202 is produced to phase comparison block 204. Phase comparison block 204 also receives an oven controlled crystal output (OCXO) 206 from OCXO crystal oven 208. A difference in phase, or error signal, is produced to a digital control loop algorithm 210 which provides a representation of a digital phase difference to adaptive training algorithm 212. A correction signal decision algorithm 214 of adaptive training algorithm 212 produces a correction signal to digital-to-analog converter 216 which produces an analog clock correction signal to OCXO crystal oven 208 which then generates a corrected clock 218.

A temperature sensor 220 in oven 208 produces a temperature indication to adaptive training algorithm 212 which then correlates error correction signals to the ambient temperature of the crystal. In one embodiment, the temperature indication is in the form of a voltage magnitude that corresponds to the ambient temperature that is further required to correct the clock signal due to temperature based frequency drift.

Reference oscillator input 202 produces, when a reference oscillator input is being received, a locked mode indication 222 to temperature controller 224. This locked mode indication 222 reflects a locked mode indication originated by a GPS receiver and indicates that a reliable reference clock is being received from a GPS satellite. Temperature controller 224, which includes a temperature calibration profile, generates temperature control commands 226 to crystal oven 208 as long as the locked mode indication 222 is being received. Controller 224 further generates a training indication 228 to correction signal decision algorithm 214 to prompt algorithm 214 to generate a constant signal to DAC 216 in the event that the reference oscillator input 202 is lost during training. When the training is complete or terminated, the system may operate in a holdover mode if the reference oscillator input 202 is still not being received. During the calibration phase the clock system continues to produce a useable output, hence the calibration process does not impact the normal operation of the clock in the base station.

Figure 4:
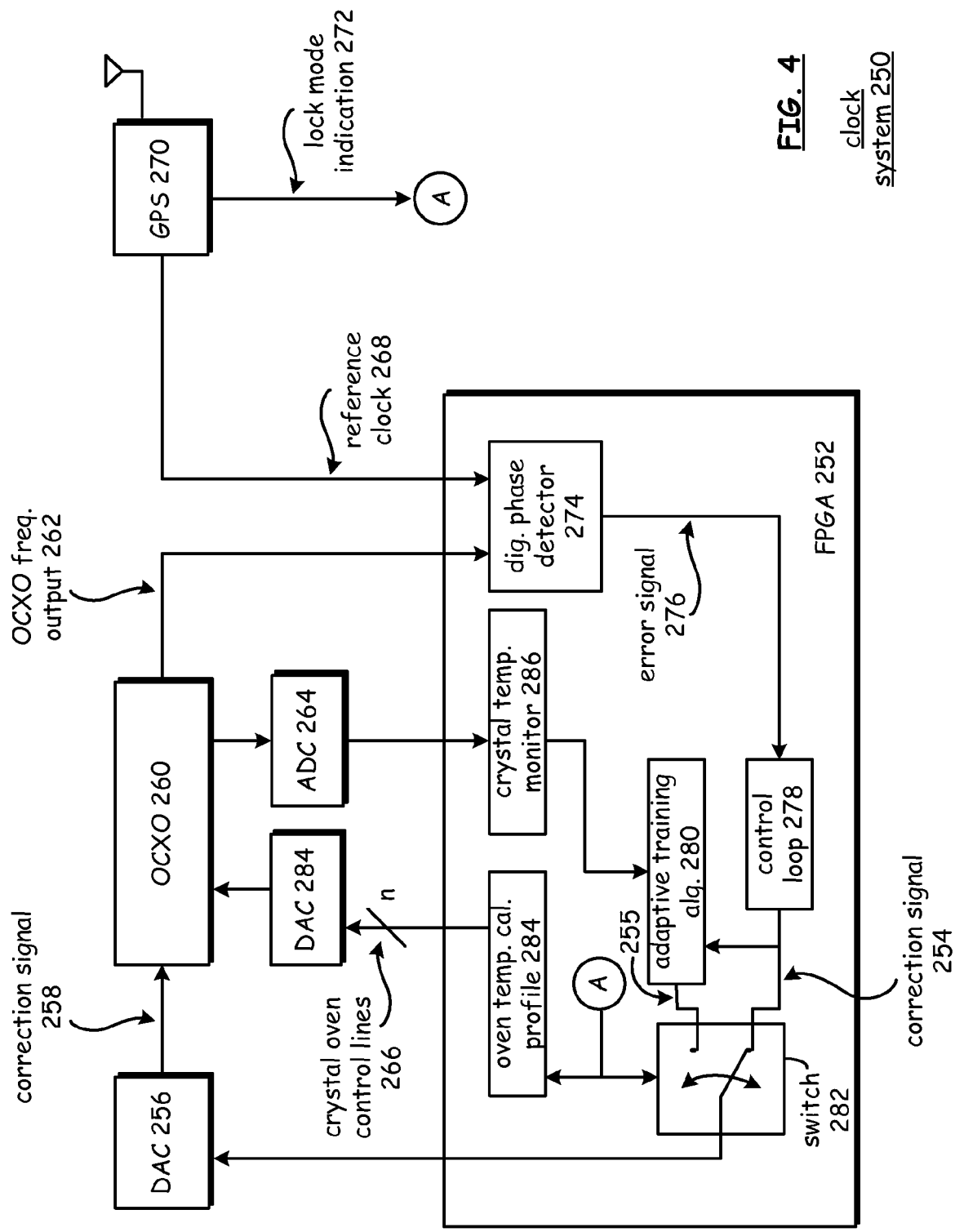
FIG. 4 is a functional block diagram of a clock system according to one embodiment of the invention.

FIG. 4 is a functional block diagram of a clock system according to one embodiment of the invention. A clock system 250 includes an FPGA 252 that produces a correction signal 254 in a digital form to a digital-to-analog (DAC) converter 256 which produces correction signal 258 in an analog form to OCXO 260. OCXO 260 produces OCXO frequency output 262 to FPGA 252. OCXO 260 also produces a temperature indication in an analog form to analog-to-digital (ADC) converter 264 which then produces a digital temperature indication to FPGA 252. A plurality of crystal oven control lines 266 also couple OCXO 260 to FPGA 252. FPGA 252 is further coupled to receive a reference clock 268 from a GPS satellite receiver 270. GPS satellite receiver 270 further produces a lock mode indication 272 which is received by FPGA 252.

In operation, FPGA 252, which includes a digital processor as well as field programmable logic, receives reference clock 268 and compares reference clock 268 to OCXO frequency output 262 in a digital phase detector 274 which produces an error signal 276 to control loop block 278. Error signal 276, in one embodiment, has a pulse width that reflects a phase difference between clock 268 and output 262. In another embodiment, Signal 276 includes a numerical representation of the phase difference. Control loop block 274 then produces correction signal 254 to both adaptive training algorithm 280 and to switch 282. When GPS 270 produces lock mode indication 272, lock mode indication 272 is received by FPGA 252 to prompt switch 282 to produce correction signal 254 to DAC 256. DAC 256 then produces correction signal 258 in an analog form based on corrective signal 254 which is in a digital form. In FIG. 4, the downward position shown as the switched position for switch 282 reflects operation in the locked mode. The upward position reflects the holdover mode of operation as described herein. In the holdover mode, a correction signal 255 is generated by adaptive training algorithm 280.

Switch 282 couples adaptive training algorithm 280 to DAC 256 when in a holdover mode. Accordingly, when in the holdover mode, adaptive training algorithm 280 produces a clock correction signal to switch 282 which, in a holdover mode, is produced to DAC 256. This correction signal is one that is similar to an expected correction signal 254 for a current ambient temperature if the clock system 250 were operating in the locked mode.

Lock mode indication 272 is also produced to oven temperature calibration profile block 284. Oven temperature calibration profile block 284 then, while in the lock mode, is operable to generate oven temperature control commands over crystal oven control lines 266 to an n-bit wide DAC 284 that produces corresponding temperature control commands in analog form to OCXO 260. Finally, OCXO 260 provides a temperature indication to ADC 264 which is received in a digital form by crystal temperature monitor 286. In one embodiment, the temperature indication is an actual temperature measurement. In the described embodiment, the temperature indication is a signal magnitude (e.g., a voltage or current) of a signal being used to drive or maintain the ambient temperature to the desired constant ambient temperature. Crystal temperature monitor 286 then provides a temperature indication to adaptive training algorithm 280 for training purposes during the locked mode of operation.

Figure 5:
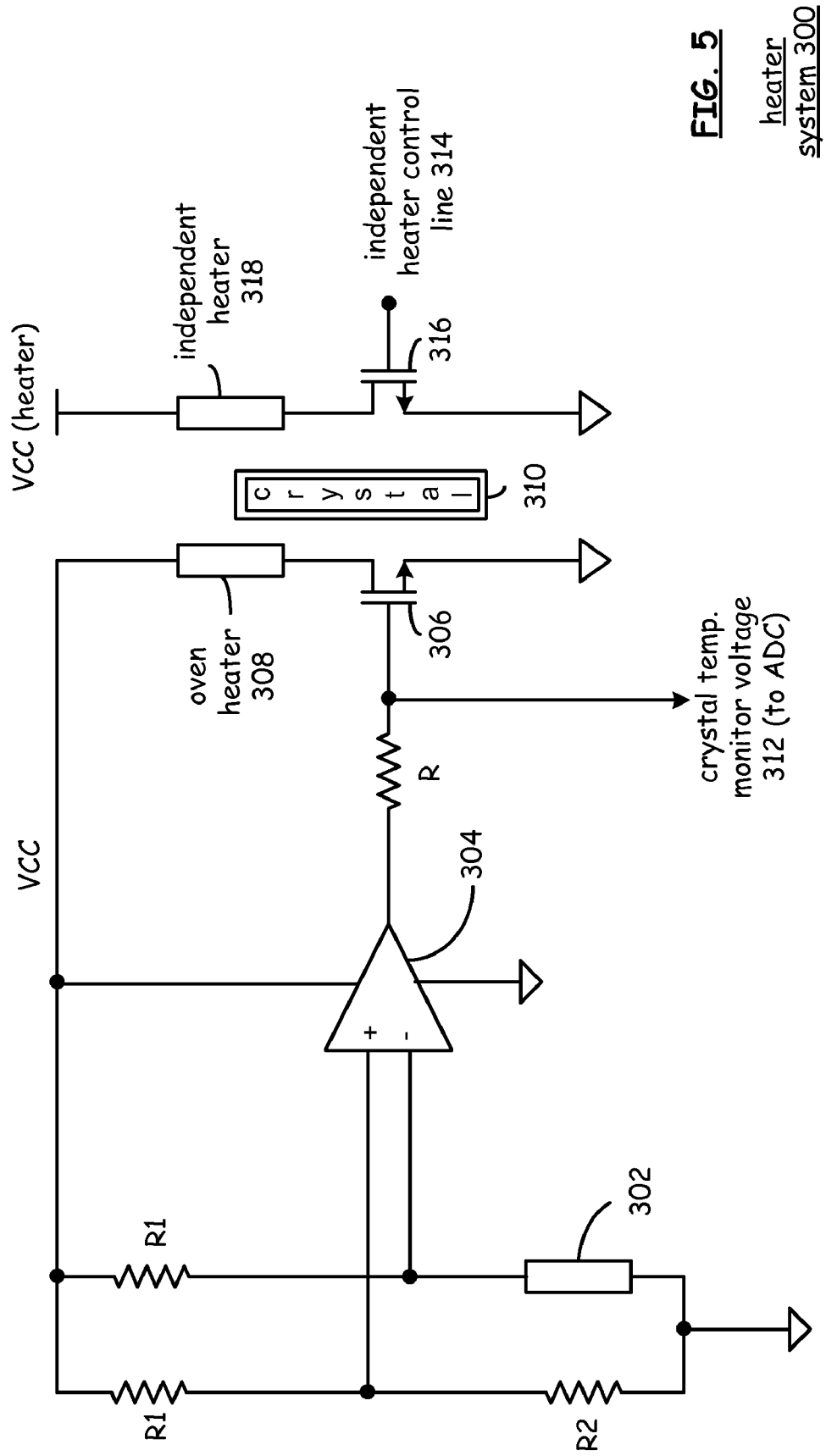
FIG. 5 is a functional schematic diagram of a heater system according to one embodiment of the invention.

FIG. 5 is a functional schematic diagram of a heater system according to one embodiment of the invention. A balanced resistor bridge having resistors R1 and R2 and a thermistor temperature sensor 302 are configured in a bridge topology with a center node of each branch being coupled to one of two inputs (the "plus" and "minus" inputs) of a comparator 304 as shown. For a specified temperature, thermistor 302 develops a resistance that is equal to R2 to create a balanced resistor bridge. Accordingly, the inputs of a comparator 304 cancel if the resistance of thermistor 302 is equal to the resistance of R2 since the input voltages to the comparator are equal. When R1 is greater than R2, and when thermistor 302 matches resistor R2, the inputs continue to cancel. When the resistance of thermistor 302 does not equal the resistance of resistor R2, however, an output voltage is produced from comparator 304 to bias transistor 306. When transistor 306 is biased on, oven heater 308 conducts current and generates heat to create a desired constant ambient temperature for crystal 310.

More specifically, the resistance of thermistor 302 changes with changes in the ambient temperature for the environment of thermistor 302 and crystal 310. The changed resistance of thermistor 302 creates an imbalance in the resistor bridge and, therefore, in the inputs to comparator 304. This increases or decreases the output of comparator 304 and, correspondingly, the bias voltage of transistor 306. As transistor 306 is biased on to conduct current, heater 308 generates heat in an amount that corresponds to the bias signal magnitude and corresponds to a current magnitude.

It should also be noted that the bias voltage is also produced as crystal temperature monitor voltage 312 which is produced to the ADC. In FIG. 4, for example, this voltage 312 is produced to ADC 264. It should be understood that this voltage 312 correlates to the ambient temperature and, therefore, to an associated frequency drift. Accordingly, this bias voltage serves as a temperature indication. In at least one embodiment, this bias voltage is mapped to a correction signal for correcting the frequency drift. Thus, the clock system of such an embodiment is operable to use a bias voltage magnitude for transistor 306 during a holdover mode to identify and generate a corresponding mapped correction signal to correct a frequency drift in holdover mode due to ambient temperature changes. Oven heater 308 and the circuitry associated with heater As may also be seen, an independent heater control line 314 provides a bias voltage for a transistor 316 to drive a current through a heater 318. Heater 318 and transistor 316 operate as a second temperature control system to change an ambient temperature for heater 310 for training purposes as described before. Temperature control commands 166 and 266 or FIGS. 2 and 3 or their equivalent may be produced to control line 314 to bias transistor 316 into an on state to operate heater 318. Heater 318 and transistor 316 reflect but one embodiment of a second temperature control system such as system 162 of FIG. 2.

Finally, it should be noted that the various circuit elements shown here in FIG. 5 may readily be replaced by comparable devices or elements. For example, other transistor types may be used in place of the N-MOS MOSFETs shown as transistors 306 and 316. For example, P-MOS MOSFETs or bipolar junction transistors, each in a variety of biasing configurations, may be used. Corresponding bias or connection changes which may be required can readily be determined by one of average skill in the art.

Figure 6:
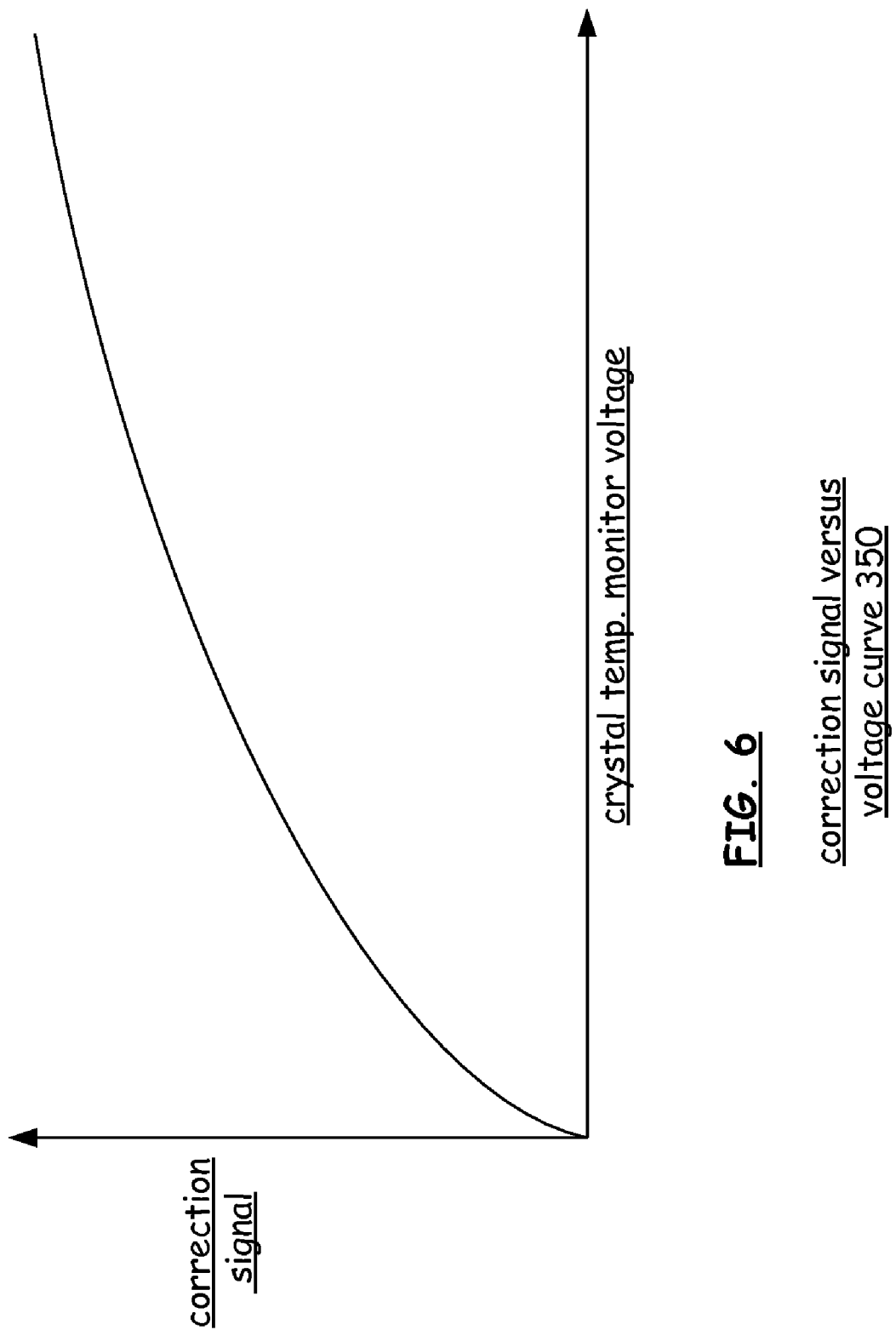
FIG. 6 is a curve that illustrates operation of one embodiment of the invention.

FIG. 6 is a curve that illustrates operation of one embodiment of the invention. As may be seen, a known relationship indicated by a non-linear curve, exists between a correction signal to correct a frequency drift of the oscillator crystal and a crystal temperature monitor voltage. As such, the monitor voltage level may be used to determine the correction signal value. It should also be noted that the response curve, here, is non-linear though a response could be linear. Accordingly, by using a second temperature control system to modify ambient temperatures, the specific non-linear relationship may be determined by an adaptive training algorithm so that a better correction signal may be applied during a holdover mode by merely monitoring a temperature indication (here, the crystal temperature monitor voltage).

FIG. 7 is a flow chart that illustrates a method according to one embodiment of the invention. The method shown in FIG. 7 is method in a communication device. The method includes receiving an external reference signal (step 400) and generating first temperature control commands (step 404) to maintain a constant ambient temperature for a crystal oscillator using a first temperature control system. The method further includes generating second temperature control commands for a second temperature control system to establish a desired ambient temperature for the crystal oscillator according to a temperature training profile (step 408).

As described herein, step 408 is performed while operating in a locked mode wherein operating in a locked mode comprises receiving an external reference signal and extracting a clock from as long as the external reference signal is being received. Operating in the locked mode further includes generating the temperature control commands and training the adaptive algorithm while performing normal transceiver operations. Finally, such training while in the locked mode includes periodically training the adaptive control algorithm to compensate for performance degradation of components within the clock system.

The method further includes, while in a locked mode, extracting a clock from the external reference signal (step 412) and generating a correction signal to further generate a corrected oscillation based on a difference between the extracted clock and the crystal oscillator (step 412). The method further includes training an adaptive control algorithm based on the correction signal in relation to a determined crystal oscillator response to temperature variations caused by the second temperature control system (step 416). The crystal frequency response to ambient temperature changes resulting from the transmitted temperature control commands (such as commands 166, for example) may be evaluated in terms of voltage magnitude levels used to maintain the constant ambient temperature in relation to correction signals to train the adaptive control algorithm. More specifically, a correction signal parameter such as a pulse width or a numerical phase value may be mapped to the voltage magnitude level.

One purpose for the training is to generate an accurate clock that compensates for frequency drift due to ambient temperature changes about the crystal oscillator. Thus, when a communication signal from a remote device, that includes the reference signal, is not being received and a clock cannot be extracted, the method includes generating a clock correction signal by the adaptive control algorithm based on the ambient temperature when the external reference signal is not being received (step 420). In one embodiment, the adaptive control algorithm generates the clock control signal based on control voltage levels being concurrently used to regulate the ambient temperature in first temperature control system. These voltage levels are used as an entry to the mapping of voltage to correction signal parameters. A corresponding correction signal is then generated to match the mapped correction signal parameter. This correction signal is then applied to the oscillator clock reference signal to correct for temperature based frequency drift.

For the above method and for each described embodiment, it should be understood that the first and second temperature control systems may each be one of many different types of known systems. In general, the first temperature control system is one that operates to maintain a constant temperature to reduce or eliminate temperature based frequency drift of an oscillator or circuit electronics. The second temperature control system is one that changes the ambient temperature during a training mode so that an amount of required correction in relation to temperature can be determined quickly while reducing construction and deployment time (by eliminating such training from fabrication and deployment) and so that the system may readily be recalibrated while in use to compensate for other factors of frequency drift. For example, a working system may self calibrate due to device performance degradation over time. For specific examples, the first and second temperature control systems may comprise complex heating and cooling systems. Alternative, the first temperature control system may comprise a heater while the second temperature control system comprises a voltage controlled variable fan. Alternatively, both systems may comprise heaters wherein at least the first temperature control system is required to maintain a desired ambient temperature given that the oscillator is located in a refrigerated or substantially cooled environment. Thus, the second temperature control system can quickly and frequently generate exaggerated ambient temperatures without requiring a change in room temperature. The latter is advantageous when the system is extended to extract an aging rate of the crystal oscillator. Temperature calibration can be conducted in a time that is short with respect to the significant errors associated with crystal oscillation frequencies. Thereafter, a resultant temperature model, aging related frequency drift can be extracted.

The invention disclosed herein is susceptible to various modifications and alternative forms. Specific embodiments therefore have been shown by way of example in the drawings and detailed description. It should be understood that the drawings and detailed description thereto are not intended to limit the invention to the particular form disclosed, but on the contrary, the invention is to cover all modifications, equivalents and alternatives falling within the spirit and scope of the present invention as defined by the claims.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof. For example, each device, server or system described in relation to the Figures in the present specification may include, in one or more embodiments, one or more of the structural elements in a configuration similar to that of device 130 of FIG. 4 to support associated operations and communications as described in relation to the various figures.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a message but may adjust its current level, voltage level, and/or power level.

As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output(s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, messages, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

What is claimed is:

1. A communication device, comprising:
transceiver circuitry for transmitting and receiving communication signals within a wired, fiber-optic or wireless data system wherein the communication device receives a reference clock signal from a remote device and extracts a reference clock from the reference clock signal;
a crystal oscillator that generates an oscillator reference clock;
a first temperature control system that further includes a first temperature control logic that adjusts temperature settings to maintain a constant first ambient temperature for the crystal oscillator;
a second temperature control system that sets a second ambient temperature according to temperature control commands;
a second temperature control logic that generates the temperature control commands to the second temperature control system to set the second ambient temperature for the crystal oscillator; and
wherein:
the communication device generates a correction signal and a corrected clock based on a difference between the extracted reference clock and the oscillator reference clock;
the second temperature control logic generates the temperature control commands for the second temperature control system according to a temperature training profile; and
the communication device trains an adaptive control algorithm based on the correction signal in relation to a determined crystal oscillator frequency drift.

2. The communication device of claim 1 wherein the communication device comprises a base station.

3. The communication device of claim 2 wherein the received clock reference signal is a received communication signal from a satellite based transmission.

4. The communication device of claim 2 wherein the second temperature control system generates the temperature control commands to train the adaptive control algorithm while transmitting and receiving wireless communication signals within cellular or wireless data networks.

5. The communication device of claim 1 wherein the communication device periodically trains the adaptive control algorithm to compensate for performance degradation of components within the communication device.

6. The communication device of claim 1 wherein the communication device operates in a locked mode when the clock reference signal is being received.

7. The communication device of claim 6 wherein:
the communication device only trains the adaptive control algorithm in the locked mode;
the communication device operates in a holdover mode when the clock reference signal is not being received; and
while operating in the holdover mode:
the second temperature control logic generates the temperature control commands for the second temperature control system to maintain a constant second ambient temperature; and
the communication device generates a temperature compensated clock that is based on the oscillator reference clock and a correction signal that corresponds to temperature setting adjustments in the first temperature control system.

8. The communication device of claim 7 wherein the communication device generates the clock based upon the adaptive control algorithm in relation to detected temperature variations.

9. The communication device of claim 1 wherein the communication device generates a temperature compensated clock when the communication device is not receiving the reference clock signals by evaluating control voltage levels used to regulate the constant first ambient temperature.

10. A method in a wireless base station, comprising:
receiving clock reference signals in satellite based transmissions;
generating first temperature control commands to maintain a constant ambient temperature for a crystal oscillator using a first temperature control system;
generating second temperature control commands for a second temperature control system to establish a desired ambient temperature for the crystal oscillator according to a temperature training profile;
extracting a reference clock from the satellite based transmissions;
generating an oscillator reference clock;
generating a correction signal to further generate a corrected oscillation based on a difference between the extracted reference clock and the oscillator reference clock; and
while the reference clock signals are being received to allow the reference clock to be extracted, training an adaptive control algorithm based on the correction signal in relation to determined first temperature control commands that are generated to compensate for the ambient temperature variations produced by the second temperature control system.

11. The method of claim 10 wherein training the adaptive control algorithm includes generating the second temperature control commands and training the adaptive algorithm while performing normal base station operations.

12. The method of claim 10 further including periodically training the adaptive control algorithm to compensate for performance degradation of components within the base station.

13. The method of claim 10 wherein training the adaptive control algorithm occurs in a locked mode while the satellite communication signals are being received and the reference clock is being extracted, the method further including operating in a holdover mode, wherein operating in a holdover mode occurs when the reference clock signals are not being received and the reference clock cannot be extracted.

14. The method of claim 13 further including generating a clock control signal based upon the adaptive control algorithm in relation to the ambient temperature while in the holdover mode.

15. The method of claim 13 further including generating a clock control signal based on control voltage levels used to regulate the ambient temperature in first temperature control system.

16. A method in a communication device, comprising:
receiving an external clock reference signal;
generating first temperature control commands to maintain a constant ambient temperature for a crystal oscillator using a first temperature control system;
generating second temperature control commands for a second temperature control system to establish a desired ambient temperature for the crystal oscillator according to a temperature training profile;
extracting a clock from the external clock reference signal;
generating an oscillator reference signal;
generating a correction signal to further generate a corrected oscillator reference signal based on a difference between the extracted clock and the oscillator reference signal; and
training an adaptive control algorithm based on the correction signal in relation to the first temperature control commands generated in response to temperature variations caused by the second temperature control system.

17. The method of claim 16 further including operating in a locked mode wherein operating in a locked mode comprises receiving the external clock reference signal and extracting the clock as long as the external clock reference signal is being received.

18. The method of claim 17 wherein operating in the locked mode further includes generating the temperature control commands and training the adaptive algorithm while performing normal transceiver operations.

19. The method of claim 17 further including periodically training the adaptive control algorithm to compensate for performance degradation of components within the communication device.

20. The method of claim 17 further including generating the oscillator reference signal based upon a correction signal produced by the adaptive control algorithm in relation to the ambient temperature when the external reference signal is not being received.

21. The method of claim 20 further including generating a correction signal based on control voltage levels used to regulate the ambient temperature in first temperature control system.

* * * * *